(12) United States Patent
Chen (10) Patent No.: US 11,087,853 B2
(45) Date of Patent: Aug. 10, 2021

(54) POWER-ON OVER-ERASURE CORRECTION METHOD AND MEMORY DEVICE UTILIZING SAME

(71) Applicant: Elite Semiconductor Memory Technology Inc., Hsinchu (TW)

(72) Inventor: Chih-Hao Chen, New Taipei (TW)

(73) Assignee: ELITE SEMICONDUCTOR MEMORY TECHNOLOGY INC., Hsinchu (TW)

( * ) Notice: Subject to any disclaimer, the term of this patent is extended or adjusted under 35 U.S.C. 154(b) by 101 days.

(21) Appl. No.: 16/565,518

(22) Filed: Sep. 10, 2019

(65) Prior Publication Data

US 2021/0074371 A1 Mar. 11, 2021

(51) Int. Cl.
*G11C 16/34* (2006.01)
*G11C 16/30* (2006.01)
*G11C 16/26* (2006.01)

(52) U.S. Cl.
CPC .......... *G11C 16/3404* (2013.01); *G11C 16/26* (2013.01); *G11C 16/30* (2013.01); *G11C 16/344* (2013.01)

(58) Field of Classification Search
CPC ............................ G11C 16/3404; G11C 16/34
USPC .................................................... 365/185.11
See application file for complete search history.

(56) References Cited

U.S. PATENT DOCUMENTS

| 6,370,065 | B1* | 4/2002 | Pan ...................... | G11C 16/344 365/185.11 |
| 8,995,198 | B1* | 3/2015 | Kathawala ............. | G11C 16/12 365/185.19 |
| 2011/0188308 | A1* | 8/2011 | Chen ...................... | G11C 16/04 365/185.3 |
| 2012/0195123 | A1* | 8/2012 | Lee .................... | G11C 16/3409 365/185.12 |
| 2015/0029794 | A1* | 1/2015 | Romanovskyy .... | G11C 11/4091 365/189.02 |
| 2016/0005463 | A1* | 1/2016 | Park ..................... | G11C 29/028 365/148 |
| 2019/0196959 | A1 | 6/2019 | Ji | |

* cited by examiner

*Primary Examiner* — Muna A Techane
(74) *Attorney, Agent, or Firm* — Winston Hsu (57) ABSTRACT

A memory device includes a plurality of memory blocks and each memory block includes a plurality of columns of memory cells. Each column of memory cells is coupled to a corresponding bit line. Upon completion of a power-up sequence, detect if a current leakage of corresponding columns in a group of memory blocks is greater than a predetermined level. If the current leakage of the corresponding columns in the group of memory blocks is greater than the predetermined level, perform an over-erasure correction on the corresponding columns.

17 Claims, 6 Drawing Sheets

POWER-ON OVER-ERASURE CORRECTION METHOD AND MEMORY DEVICE UTILIZING SAME

BACKGROUND OF THE INVENTION

1. Field of the Invention

The invention relates to flash memory, and more specifically, to a power-on over-erasure correction method and memory device utilizing the same.

2. Description of the Prior Art

Flash memories are widely adopted for non-volatile data storage in various electronic devices. A flash memory includes an array of memory cells that can be programmed, erased and read. Each memory cell may be set to an erased state or a programmed state.

In an erasing operation, the array of memory cells, typically a memory block, are first pre-programmed into the programmed state to bring all memory cells to a known level, then an erasing pulse is applied to the memory block for a certain amount of time to remove charges therefrom and set the memory cells to the erased state, and finally an over-erasure correction is applied to the memory block to tighten the distribution of the threshold voltages of the memory cells. Nevertheless, in the case where the flash memory is shut down prior to completion of the over-erasure correction, over-erased cells will remain uncorrected after power-on, resulting in possible false data reading from the flash memory owing to a background current leakage drawn by the over-erased cells. For example, for 512 memory cells being coupled to a bit line, if a substantial number of memory cells on the bit line are over-erased and constantly draw current leakages even when unselected, the cumulative current on the bit line can exceed a cell read current, causing the flash memory inoperative. In addition, the current leakages may introduce power dissipation loss and overload the bit line power supply during programming.

Therefore, it is desirable to provide an over-erasure correction method and a memory device utilizing the same to perform a quick over-erasure correction after power-on, thereby reducing unwanted power dissipation loss, decreasing erroneous data reads and enhancing programming performance.

SUMMARY OF THE INVENTION

In one embodiment of the invention, an over-erasure correction method for use in a memory device is disclosed. The memory device includes a plurality of memory blocks and each memory block includes a plurality of columns of memory cells. Each column of memory cells is coupled to a corresponding bit line. The over-erasure correction method includes: upon completion of a power-up sequence, detecting if a current leakage of corresponding columns in a group of memory blocks is greater than a predetermined level, and if the current leakage of the corresponding columns in the group of memory blocks is greater than the predetermined level, performing an over-erasure correction on the corresponding columns.

In another embodiment of the invention, an over-erasure correction method for use in a memory device is provided. The memory device includes a plurality of memory blocks and each memory block includes a plurality of columns of memory cells. Each column of memory cells is coupled to a corresponding bit line. The over-erasure correction method includes: upon completion of a power-up sequence, detecting if a current leakage of corresponding columns in a group of memory blocks is greater than a predetermined level; if the current leakage of the corresponding columns in the group of memory blocks is greater than the predetermined level, determining which memory block of the group of memory blocks is a leaky memory block; and performing an over-erasure correction on a corresponding column of the leaky memory block.

In another embodiment of the invention, a memory device includes a plurality of bit lines, a group of memory blocks and a controller. The group of memory blocks is coupled to the plurality of bit lines. Each memory block includes memory cells and block selecting switches respectively coupled to the plurality of columns of memory cells. Each column of memory cells is coupled to a corresponding bit line. The controller is coupled to the group of memory blocks, and used to select, upon completion of a power-up sequence, the block selecting switches to detect if a current leakage of corresponding columns in a group of memory blocks is greater than a predetermined level.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
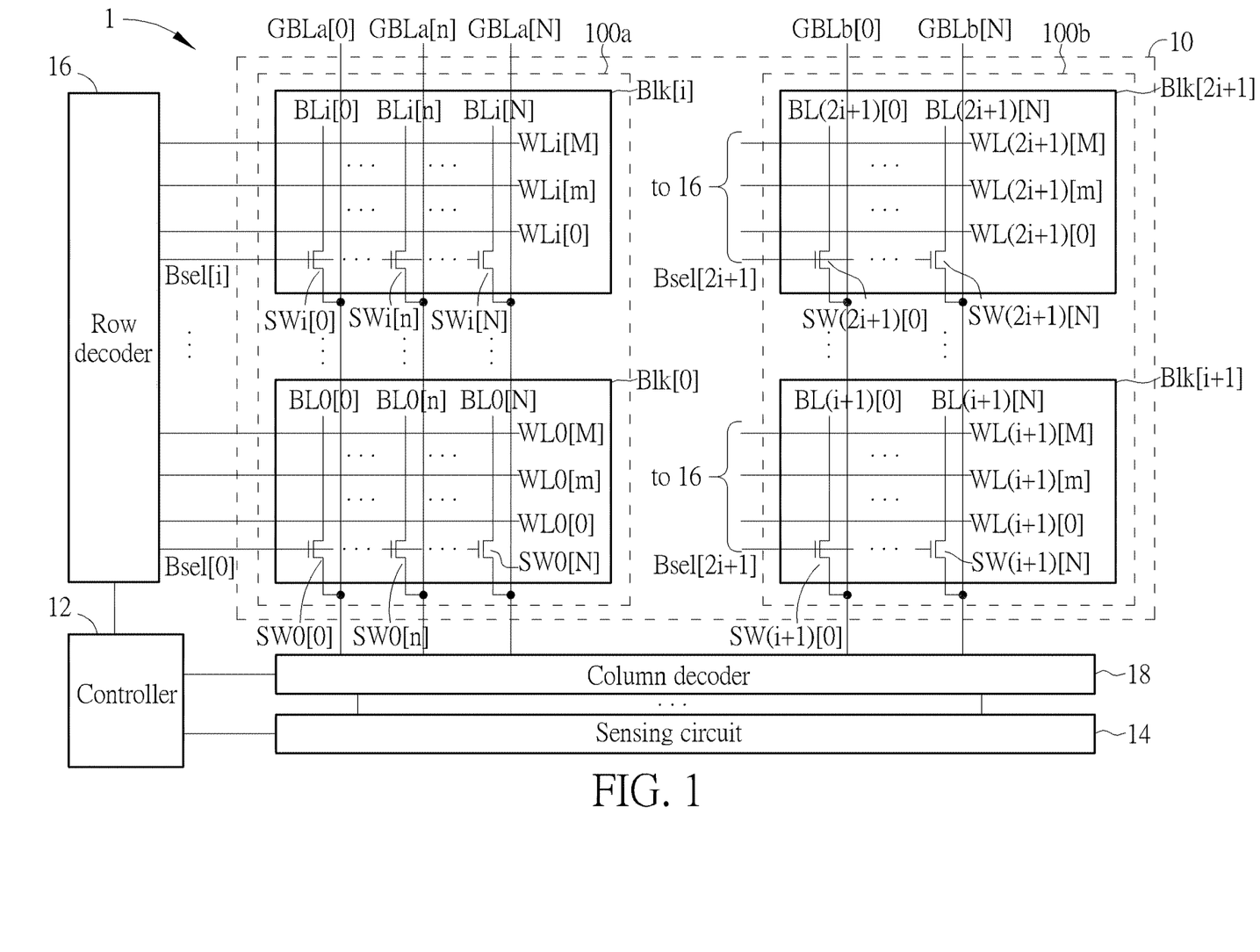
FIG. 1 is a block diagram of a memory device according to an embodiment of the invention.
Figure 2:
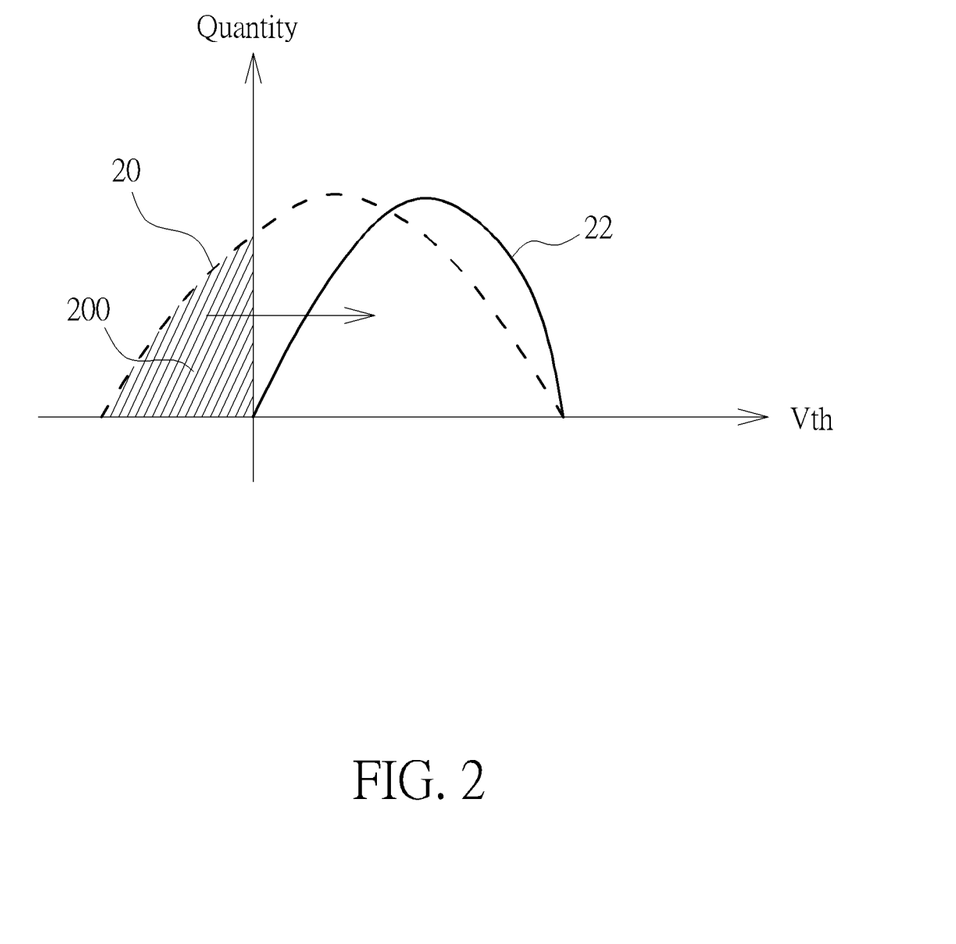
FIG. 2 illustrates a threshold voltage distribution profile for an erased state of the memory device in FIG. 1.

FIG. 1 is a block diagram of a memory device 1 according to an embodiment of the invention. The memory device 1 may be a NOR-type flash memory. Upon power-up, the memory device 1 may determine whether one or more over-erased memory cells are present, and perform an over-erasure correction upon detection of over-erased memory cells, preventing data reading failure of the memory device 1 owing to current leakages drawn by the over-erased memory cells. FIG. 2 illustrates threshold voltage distribution profiles 20 and 22 for an over-erasure state and an over-erasure corrected state of memory cells in the memory device 1, respectively, with the horizontal axis representing threshold voltages and the vertical axis representing quantities of memory cells. After an erasing operation, over-erased memory cells in a shaded region 200 may have threshold voltages below a minimum desired threshold voltage (e.g., 0V) of the erasure state, and a voltage pulse may be applied to the over-erased memory cells to bring the threshold voltages back to above the minimum desired threshold voltage. The operation of bringing back the threshold voltages of over-erased memory cells to above the minimum desired threshold voltage is referred to as an over-erasure correction process.

Referring to FIG. 1, the memory device 1 comprises a plurality of block selecting lines Bsel[0] to Bsel[2i+1], a plurality of bit lines BL0[0] to BL(2i+1)[N], a plurality of global bit lines GBLa[0] to GBLa[N], GBLb[0] to GBLb[N] and a plurality of word lines WL0[0] to WL(2i+1)[M], N and M being positive integers. For example, i may be 3, N may be 1023 and M may be 127 for the memory device 1 having 8 block selecting lines, 8192 bit lines and 1024 word lines. The memory device 1 further comprises a memory array 10, a controller 12, a sensing circuit 14, a row decoder 16 and a column decoder 18. The memory array 10 is coupled to the row decoder 16 and the column decoder 18. The controller 12 is coupled to the row decoder 16, the column decoder 18 and the sensing circuit 14. The sensing circuit 14 is coupled to the column decoder 18.

The memory array 10 comprises an array of memory cells arranged into columns and rows and grouped into memory blocks Blk[0] to Blk[2i+1]. For example, a 1 Mb memory device 1 may be divided into 8 memory blocks of 128 kb each, and each memory block may be arranged into 1k columns and 128 rows. The memory blocks Blk[0] to Blk[2i+1] may be selected using control signals on the block selecting lines Bsel[0] to Bsel[2i+1], respectively. The memory blocks Blk[0] to Blk[2i+1] may be organized into search groups 100a and 100b, each search group containing (i+1) memory blocks and i being a positive integer. For example, i may be 3 and each search group may contain 4 memory blocks. The memory blocks Blk[0] to Blk[2i+1] may contain block selecting switches SW0[0] to SW(2i+1)[N]. The plurality of bit lines BL0[0] to BL(2i+1)[N] may be divided into sets of bit lines BL0[0] to BL0[N]; . . . ; BLi[0] to BLi[N]; BL(i+1)[0] to BL(i+1)[N]; . . . ; BL(2i+1)[0] to BL(2i+1)[N]. Each set of bit lines may be used to address columns in a specific memory block. For example, the set of bit lines BLi[0] to BLi[N] may be used to address columns in the memory block Blk[i]. The global bit lines GBLa[0] to GBLa[N], GBLb[0] to GBLb[N] may be coupled to corresponding columns in the search groups 100a and 100b via bit lines BL0[0] to BL(2i+1)[N]. For example, the global bit line GBLa[0] is coupled to the first corresponding columns in the search group 100a via the bit lines BL0[0] to BLi[0]. The block selecting switches in each memory block may be coupled to the set of bit lines addressing the memory block. For example, the memory block Blk[0] may contain block selecting switches SW0[1] to SW0[N] coupled to the set of bit lines BL0[1] to BL0[N], respectively. When the block selecting switches SW0[0] to SW(2i+1)[N] are turned on, the corresponding memory blocks Blk[0] to Blk[2i+1] may be selected; when the block selecting switches SW0[0] to SW(2i+1)[N] are turned off, the corresponding memory blocks Blk[0] to Blk[2i+1] may be deselected. The block selecting switches SW0[0] to SW(2i+1)[N] may respectively control connections from the bit lines BL0[0] to BL(2i+1)[N] to the column decoder 18 and the sensing circuit 14. For example, the block selecting switches SW0[0] to SW0[N] may control connections from the bit lines BL0[0] to BL0[N] to the column decoder 18 and the sensing circuit 14.

The row decoder 16 may be coupled to the block selecting switches SW0[0] to SW(2i+1)[N] via the block selecting lines Bsel[0] to Bsel[2i+1] to select one or more of the memory blocks Blk[0] to Blk[2i+1]. The row decoder 16 may be further coupled to the rows of the memory blocks Blk[0] to Blk[2i+1] via the word lines WL0[0] to WL(2i+1)[M] to apply appropriate voltage levels to selected rows for reading, programming, erasing and performing an over-erasure correction on selected memory cells. The column decoder 18 may be coupled to the columns of the memory blocks Blk[0] to Blk[2i+1] via the bit lines BL0[0] to BL(2i+1)[N] to select which columns are to be accessed and pass currents from the selected columns to the sensing circuit 14. The sensing circuit 14 may detect cumulative current leakage of all selected corresponding columns in one search group using the global bit lines GBLa[0] to GBLa[N], GBLb[0] to GBLb[N]. For example, when the bit lines BL0[3] to BLi[3] are selected by the column decoder 18, the sensing circuit 14 may detect a cumulative current leakage flowing through all the fourth columns of the blocks Blk[0] to Blk[i] via the global bit line GBLa[3]. The sensing circuit 14 may be a 16-bit sense amplifier capable of detecting 16 currents drawn by 16 selected columns in one operation, or a multi-bit sense amplifier capable of detecting a multiple of 16-bit currents drawn by a multiple of 16 selected columns in one operation, e.g., the multiple of 16-bit may be 32-bit. For example, when the bit lines BL0[0] to BLi[0], . . . , BL0[15] to BLi[15] are selected by the column decoder 18 respectively, the sensing circuit 14 may detect 16 cumulative current leakages flowing through the first 16 columns of the blocks Blk[0] to Blk[i] via the global bit lines GBLa[0] to GBLa[15].

The controller 12 may control operations of the row decoder 16, the column decoder 18 and the sensing circuit 14 to perform reading, programming, erasing, over-erasure verification, over-erasure correction, and other verification operations on selected memory cells.

Although only 2 search groups 100a and 100b are shown in the memory device 1, it should be understood that any number of search groups may be incorporated in the memory array 10. Detailed operations of the memory device 1 will be explained in over-erasure correction methods 3, 4, 5 in the subsequent paragraphs.

Figure 3:
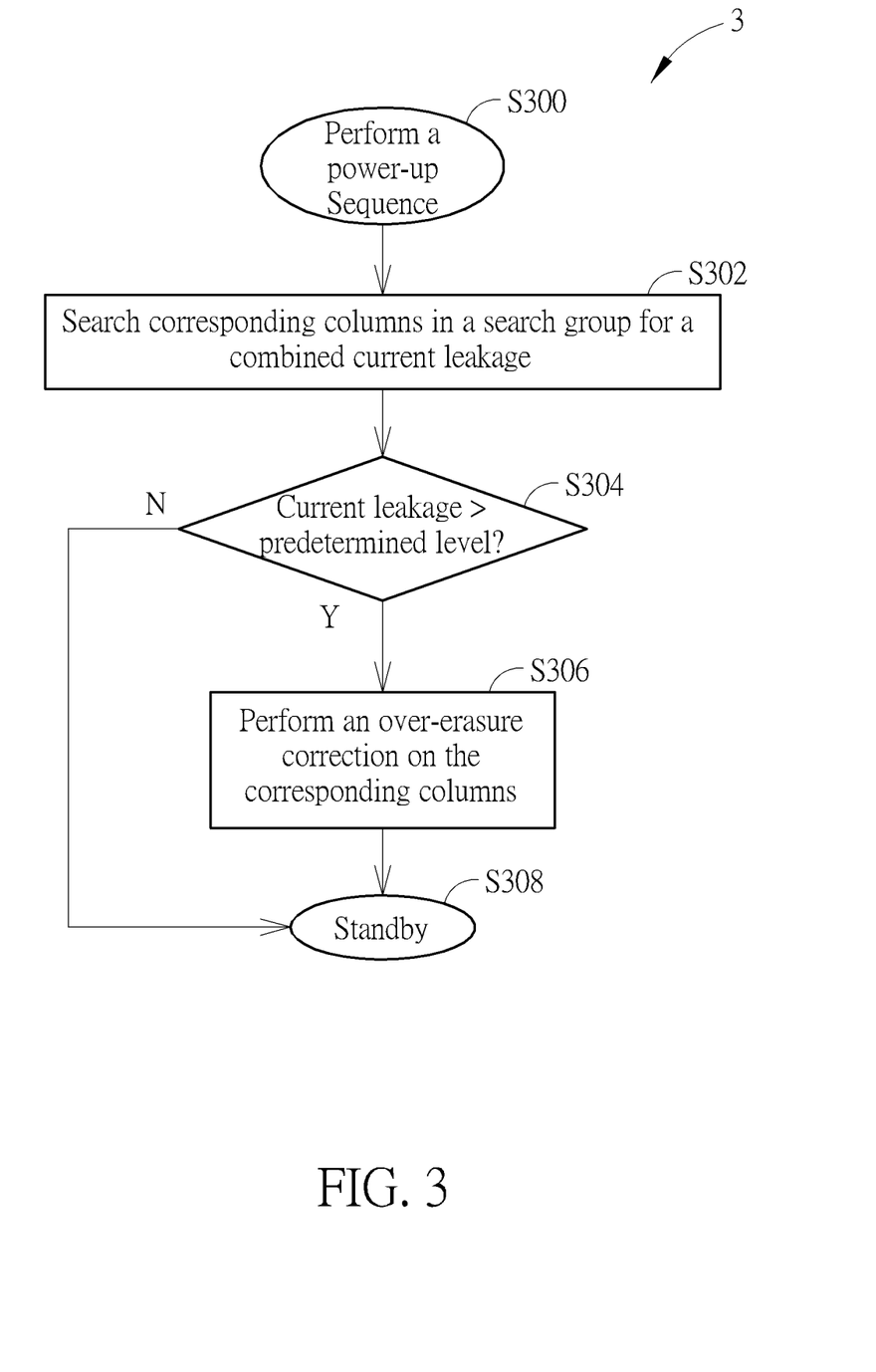
FIG. 3 is a flowchart of an over-erasure correction method for use by the memory device in FIG. 1.

FIG. 3 shows a flowchart of an over-erasure correction method 3 for use by the memory device 1. The over-erasure correction method 3 comprises Steps S300 to S308, wherein Steps S300 and S308 are respectively the start step and end step of the over-erasure correction method 3, Steps S302 to S306 are utilized to perform an over-erasure verification, and Step S306 is utilized to perform an over-erasure correction. Any reasonable technological change or step adjustment is within the scope of the disclosure. Steps S300 to S308 are explained as follows:

Step S300: Perform a power-up sequence;

Step S302: Search corresponding columns in a search group for a current leakage;

Step S304: Is the current leakage greater than a predetermined level? If so, go to Step S306, and if not, go to Step S308;

Step S306: Perform an over-erasure correction on the corresponding columns;

Step S308: Enter a standby mode.

After power-on, the memory device 1 performs a sequence of steps in a specified time interval to ensure proper subsequent operations of the memory device 1, the sequence of steps being referred to as a power-up sequence (S300). Upon completion of the power-up sequence, the controller 12 simultaneously selects the block selecting switches SW0[0] to SWi[N] of the search group 100a to search the first corresponding columns in the search group 100a for a current leakage (S302). Next, the sensing circuit 14 detects if the current leakage of the first corresponding columns of the search group 100a is greater than a predetermined level (S304). The value of the predetermined level may be selected based on the leakage current on the bit line without causing the flash memory inoperative, and may be 2 uA. If the current leakage is less than the predetermined level, there may be no over-erased memory cell in the first corresponding column, the memory device 1 enters a standby mode in which data in the memory device 1 is ready for access (S308). If the current leakage is greater than the predetermined level, an over-erasure condition is identified and the controller 12 performs an over-erasure correction on the search group 100*a* by applying an over-erasure correction pulse to the search group 100*a* to pull the threshold voltages of over-erased memory cells back to above the minimum desired threshold voltage of the erasure state (S306). The over-erasure correction may be performed on the basis of a search group or a memory block, and are respectively detailed in FIGS. 5 and 6. In some embodiments, Steps S302, S304 and S306 are iterated over the remaining corresponding columns of the search group 100*a* and all corresponding columns of the search group 100*b* to correct over-erased cells in the memory array 10. After the over-erasure condition is corrected, the memory device 1 enters the standby mode (S308).

Figure 4:
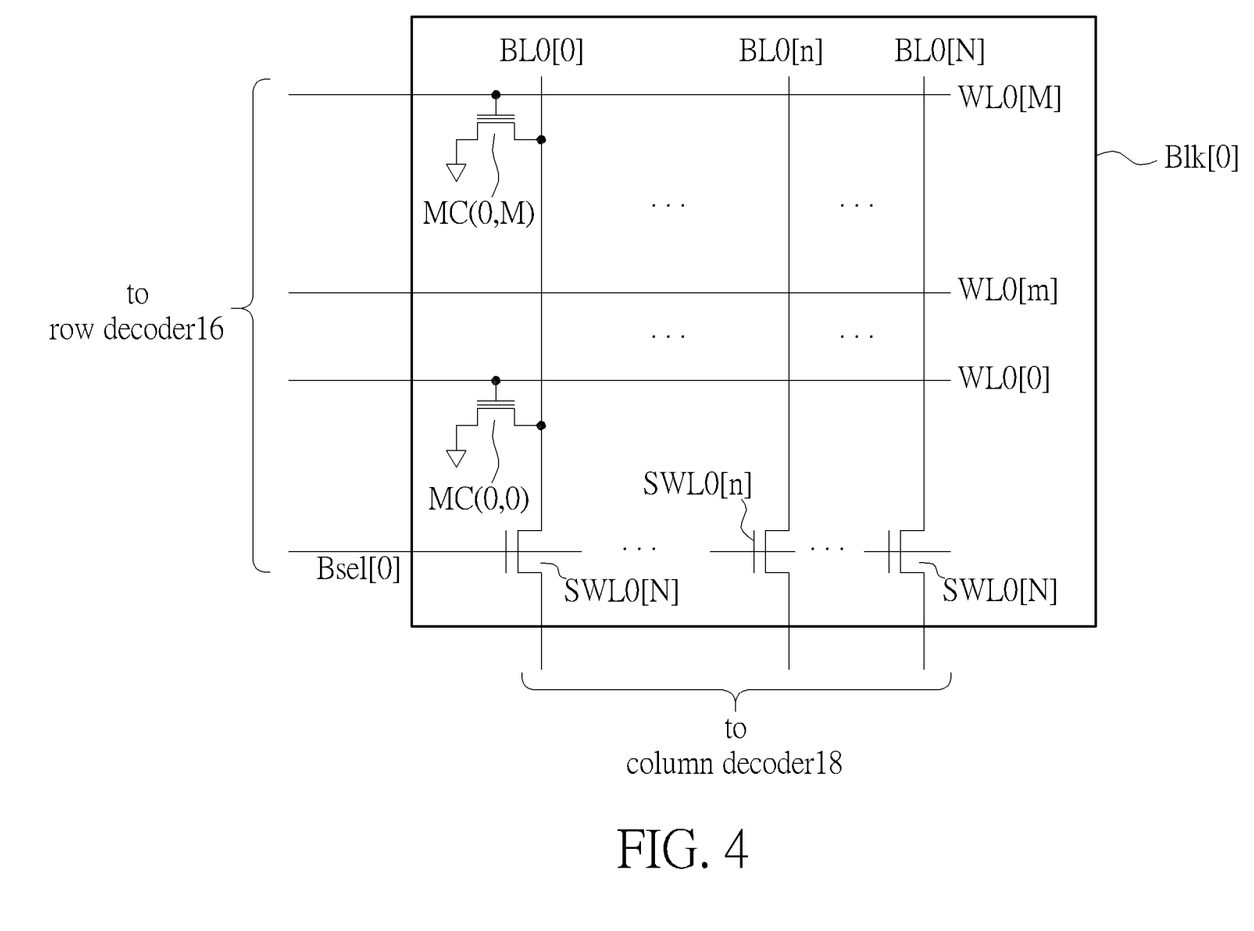
FIG. 4 is a schematic diagram of a memory block in the memory device in FIG. 1.

FIG. 4 shows a schematic diagram of the memory block Blk[0] in the memory device 1. The memory block Blk[0] includes a plurality of memory cells MC(0,0) to MC(N,M) and the block selecting switches SW0[0] to SW0[N]. The memory cells MC(0,m) to MC(N,m) are coupled to the bit lines BL0[0] to BL0[N], respectively, and the memory cells MC(n,0) to MC(n,M) are coupled to the word lines WL0[0] to WL0[M], respectively. In one embodiment of the over-erasure verification, the controller 12 may unselect the word lines WL0[0] to WL0[M] by applying thereto the minimum desired threshold voltage of the erasure state such as 0V or a few hundred mini-volt via the row decoder 16, while selecting one or more columns via the column decoder 18 for the sensing circuit 14 to detect the current leakages therein. In one embodiment of the over-erasure correction, the controller 12 may apply an over-erasure correction pulse to a selected column via the column decoder 18 while applying the minimum desired threshold voltage to all word lines WL0[0] to WL0[M] via the row decoder 16. As a result, only over-erased cells will be turned on to receive the over-erasure correction pulse, while correctly erased cells will remain off without being corrected by the over-erasure correction pulse. The over-erasure correction pulse may be smaller in magnitude than a programming pulse.

Figure 5:
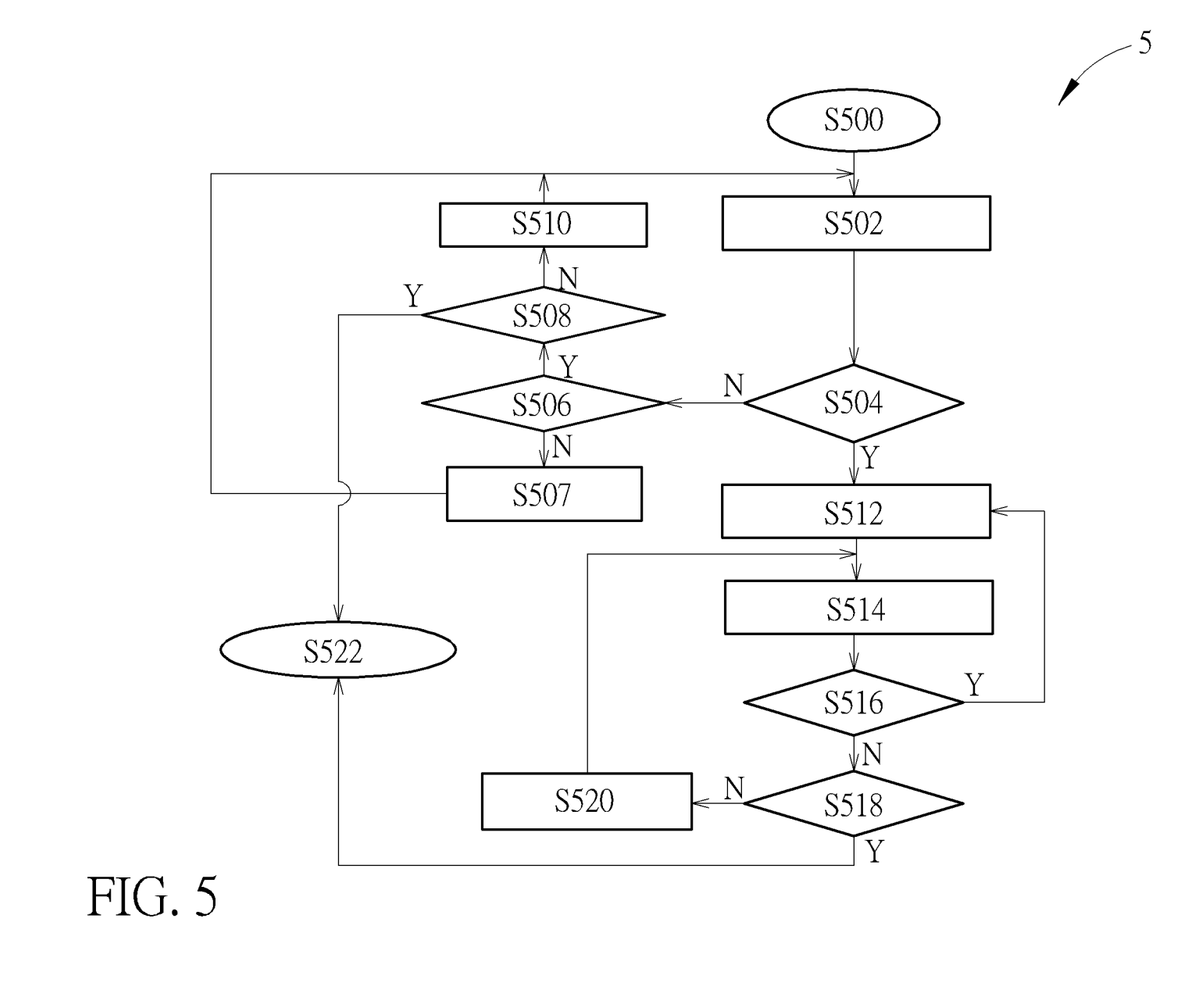
FIG. 5 is a flowchart of another over-erasure correction method for use by the memory device in FIG. 1.

FIG. 5 is a flowchart of an over-erasure correction method 5 for use by the memory device 1. The over-erasure correction method 5 is used to detect and correct an over-erasure condition on the basis of a search group. The over-erasure correction (OEC) method 5 comprises Steps S500 to S522. Steps S500 and S522 are respectively the start step and end step of the over-erasure correction method 5, Steps S502 to S510 are utilized to perform an over-erasure verification on a search group, and Steps S512 to S520 are utilized to perform an over-erasure correction on a leaky search group. Any reasonable technological change or step adjustment is within the scope of the disclosure. Steps S500 to S522 are explained as follows:

S500: Perform a power-up sequence;
S502: Perform an over-erasure verification on a search group;
S504: A leaky search group has been found? If so, go to Step S512, and if not, go to Step S506
S506: The last bit line of the search group has been reached? If so, go to Step S508, and if not, go to Step S507;
S507: Select the next bit lines; go to Step S502;
S508: The last search group has been reached? If so, go to Step S522, and if not, go to Step S510;
S510: Select the next search group; go to Step S502;
S512: Perform an OEC on the leaky search group;
S514: Perform an over-erasure verification on the corrected search group;
S516: Is the over-erasure verification failed? If so, go to Step S512, and if not, go to Step S518;
S518: The last bit line of the search group has been reached? If so, go to Step S522, and if not, go to Step S520;
S520: Select the next bit line; go to Step S514;
S522: Enter a standby mode.

Initially, the memory device 1 performs a power-up sequence after power-on (S500). Upon completion of the power-up sequence, the controller 12 performs an over-erasure verification on the first 16 corresponding columns of the search group 100*a* by selecting the block selecting switches SW0[0] to SWi[N] via the row decoder 16 and selecting the first 16 corresponding columns of the search group 100*a* via the column decoder 18 for the sensing circuit 14 to detect 16 current leakages of the first 16 columns of the search group 100*a* (S502), and determines whether the search group 100*a* is a leaky search group by detecting if any of the 16 current leakages of the first 16 corresponding columns of the search group 100*a* is greater than a predetermined level. The controller 12 determines that the search group 100*a* is a leaky search group if any of the 16 current leakages is greater than the predetermined level, and determines that the search group 100*a* is not a leaky search group if all of the 16 current leakages are less than a predetermined level. The value of the predetermined level may be selected based on the leakage current on the bit line without causing the flash memory inoperative, and may be 2 uA. When the search group 100*a* is not a leaky search group, the controller 12 determines whether the last bit line of the search group 100*a* has been reached (S506), and if not, the controller 12 selects the next 16 bit lines coupled to the next 16 corresponding columns of the search group 100*a* (S507), and repeats Steps S502 and S504 to search the next 16 corresponding columns of the search group 100*a* for a current leakage. The controller 12 repeats Steps S502 to S507 for the remaining corresponding columns of the search group 100*a* if none of current leakages exceeding the predetermined level. If the last bit line of the search group 100*a* has been reached and yet no leaky search group has been found, the controller 12 further determines whether the last search group 100*b* has been reached (S508). If so, all search groups in the memory device have been searched and no over-erased cell has been found, the memory device 1 enters the standby mode and is ready for subsequent operations (S522). If the last search group 100*b* has not been reached, the controller 12 selects the next search group 100*b* by selecting the block selecting switches SW(i+1)[0] to SW(2i+1)[N], and iterates Steps S502 to S510 over corresponding columns of the search group 100*b* until the over-erasure verification has been completed for the last bit line BL(2i+1)[N] of the last search group 100*b* and the memory device 1 enters the standby mode in Step S522.

If, in Step S504, the search group 100*a* has been identified as a leaky search group, the controller 12 then performs an OEC on the leaky search group 100*a* by applying an over-erasure correction pulse to 16 corresponding columns of all blocks Blk[0] to Blk[i] of the search group 100*a* (S512), performs an over-erasure verification on the corrected search group 100*a* by selecting the 16 corresponding columns of the search group 100*a* for the sensing circuit 14 to detect current leakages of the 16 corresponding columns and determining whether there is still a current leakage exceeding the predetermined level (S514). Next, the controller 12 determines whether the over-erasure verification is failed in accordance with the level of the current leakage (S516). If the current leakage is greater than the predetermined level, the controller 12 determines that the over-erasure verification is failed, and if the current leakage is less than the predetermined level, the controller 12 determines that the over-erasure verification succeeds. The controller 12 loops through Steps S512 to S516 until the over-erasure verification succeeds. If the over-erasure verification succeeds, the controller 12 determines whether the last bit line of the search group has been reached (S518), and if not, the controller 12 selects the next 16 bit lines coupled to the next 16 corresponding columns of the search group 100a (S520), and repeats Steps S512 to S520 to carry out over-erasure verifications and OECs for the next 16 corresponding columns of the search group 100a. If the controller 12 determines that the last bit line BL0[N] of the search group 100a has been reached in Step S518, the controller 12 enters the standby mode (S522).

Figure 6:
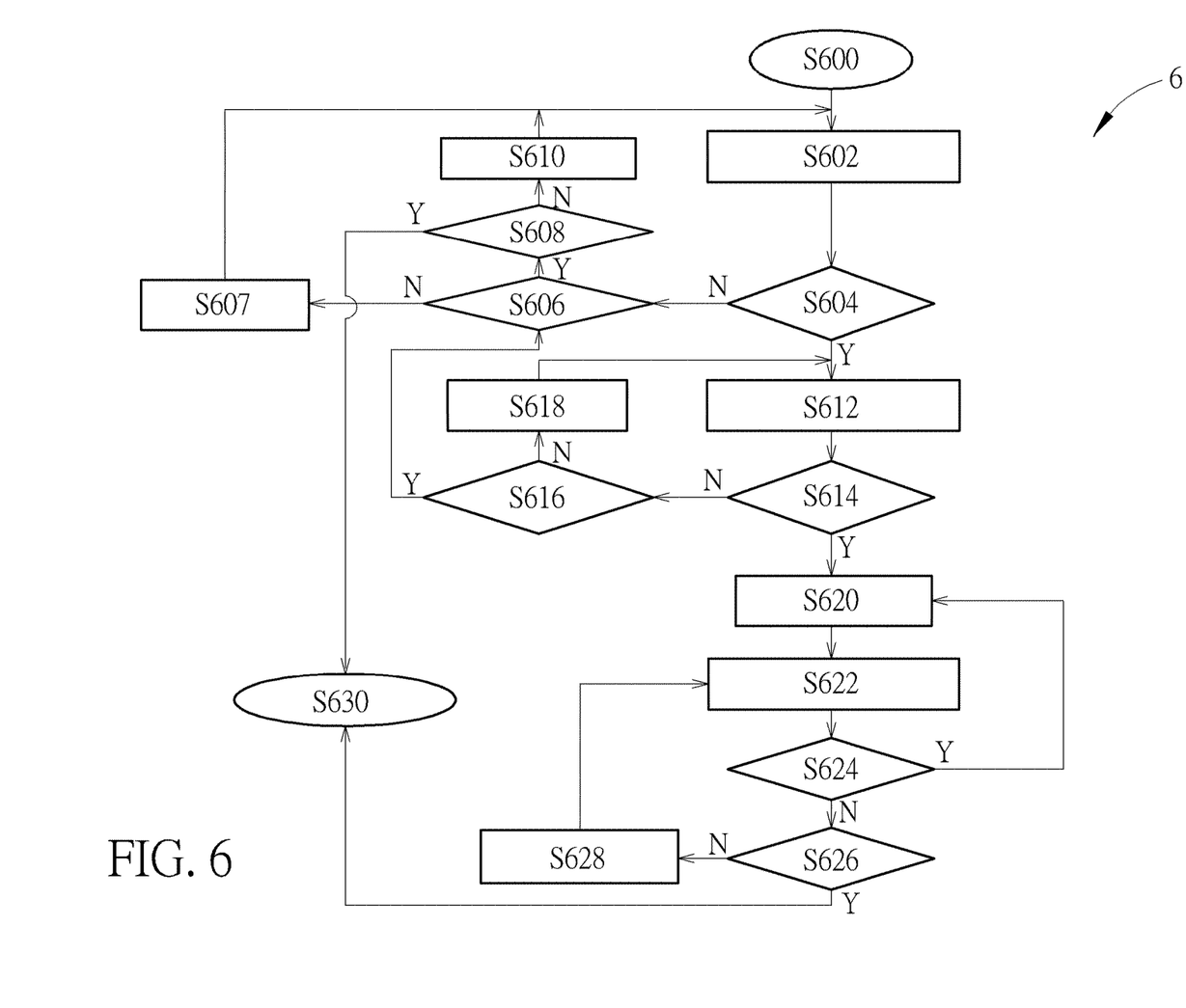
FIG. 6 is a flowchart of yet another over-erasure correction method for use by the memory device in FIG. 1.

FIG. 6 is a flowchart of an over-erasure correction method 6 for use by the memory device 1. The over-erasure correction method 6 is used to detect and correct an over-erasure condition on the basis of a memory block. The over-erasure correction method 6 comprises Steps S600 to S630. Steps S600 and S630 are respectively the start step and end step of the over-erasure correction method 6, Steps S602 to S610 are utilized to perform an over-erasure verification on a search group, Steps S612 to S618 are utilized to perform an over-erasure verification on a memory block of a leaky search group, and Steps S620 to S628 are utilized to perform an over-erasure correction on a leaky memory block. Any reasonable technological change or step adjustment is within the scope of the disclosure. Steps S600 to S630 are explained as follows:

S600: Perform a power-up sequence;
S602: Perform an over-erasure verification on a search group;
S604: A leaky search group has been found? If so, go to Step S612, and if not, go to Step S606;
S606: The last bit line of the search group has been reached? If so, go to Step S608, and if not, go to Step S607;
S607: Select the next bit line; go to Step S602;
S608: The last search group has been reached? If so, go to Step S630; and if not, go to Step S610;
S610: Select the next search group; go to Step S602;
S612: Perform an over-erasure verification on one memory block;
S614: A leaky memory block has been found? If so, go to Step S620, and if not, go to Step S616;
S616: The last memory block of the search group has been reached? If so, go to Step S606, and if not, go to Step S618;
S618: Select the next memory block; go to Step S612;
S620: Perform an OEC on the leaky memory block;
S622: Perform an over-erasure verification on the leaky memory block;
S624: Is the over-erasure verification failed? If so, go to Step S620, and if not, go to Step S626;
S626: The last bit line of the search group has been reached? If so, go to Step S630, and if not, go to Step S628;
S628: Select the next bit line; go to Step S622;
S630: Enter a standby mode.

Steps S600 to S610 are identical to Steps S500 to S510, Step S630 is identical to S522, explanation therefor will be omitted for brevity. Upon detection of a leaky search group, e.g., the 33rd columns of the memory blocks Blk[0] to Blk[i] of the search group 100a, the controller 12 determines which memory block in the search group 100a is a leaky memory block by selecting a bit line BL0[32] coupled to the 33rd corresponding column of the memory block Blk[0] while deselecting bit lines BL1[32] to BLi[32] coupled to the 33rd corresponding columns of the remaining memory blocks Blk[1] to Blk[i] of the search group 100a, so as to perform an over-erasure verification on the 33rd corresponding column of the memory block Blk[0] via the bit line BL0[32] for the sensing circuit 10 to detect a current leakage in the bit line BL0[32] (S612). The controller 12 then determines whether the memory block Blk[0] is a leaky memory block by detecting if a current leakage of the 33rd corresponding column of the memory block Blk[0] is greater than a predetermined level (S614). The value of the predetermined level may be selected based on the leakage current on the bit line without causing the flash memory inoperative, and may be 2 uA. The controller 12 determines that the memory block Blk[0] is a leaky memory block if the current leakage is greater than the predetermined level, and determines that the memory block Blk[0] is not a leaky memory block if the current leakage is less than the predetermined level. When the memory block Blk[0] is not a leaky memory block, the controller 12 determines whether the last memory block Blk[i] of the search group 100a has been reached (S616), and if not, the controller 12 selects the bit line BL1[32] of the next memory block Blk[1] of the search group 100a (S618), while deselecting the bit lines BL0[32], BL2[32] to BLi[32] coupled to the 33rd corresponding columns of the remaining memory blocks Blk[0], Blk[2] to Blk[i], and repeats Steps S612 and S614 to search the corresponding column of the memory block Blk[1] for a current leakage. The controller 12 repeats Steps S612 to S618 for the 33rd corresponding columns of the remaining memory blocks Blk[3] to Blk[i] in the search group 100a. If no leaky memory block has been found in the 33rd corresponding columns of the memory blocks Blk[0] to Blk[i], the controller 12 goes to Step S606 to search for current leakages in the subsequent corresponding columns of the search group 100a following the 33rd corresponding columns.

If a current leakage is detected in one memory block, a leaky memory block is detected, and the controller 12 performs Steps S620 to S628 to correct the threshold voltages of the leaky memory block. In one example, the memory block Blk[1] has been detected as a leaky memory block, and the controller 12 performs Steps S620 to S628 to correct the threshold voltages of an over-erased column in the leaky memory block Blk[1]. The controller 12 performs an OEC on the leaky memory block Blk[1] by applying an over-erasure correction pulse to a corresponding column of the leaky memory block Blk[1] (S620), and performs an over-erasure verification on the corrected memory block Blk[1] by selecting the corresponding column of the memory block Blk[1] and determining whether there is still a current leakage exceeding the predetermined level (622). The controller 12 determines whether the over-erasure verification is failed in accordance with the level of the current leakage (S624). If the current leakage is greater than the predetermined level, the controller 12 determines that the over-erasure verification is failed, and if the current leakage is less than the predetermined level, the controller 12 determines that the over-erasure verification succeeds. The controller 12 loops through Steps S620 to S624 until the corresponding column in the leaky memory block Blk[1] is less than the predetermined level and the over-erasure verification succeeds. If the over-erasure verification succeeds, the controller 12 determines whether the last bit line of the memory block Blk[1] has been reached (S626), and if not, the controller 12 selects the next bit line coupled to the next corresponding column of the memory block Blk[1] (S628), and repeats Steps S620 to S628 to carry out over-erasure verifications and OECs for the next corresponding column of the memory block Blk[1]. The controller 12 iterates Steps S620 to S628 over remaining columns of the leaky memory block Blk[1] by determining if the remaining columns of the leaky memory block Blk[1] following the corresponding column of the leaky memory block Blk[1] have current leakage exceeding the predetermined level, and applying at least one over-erasure correction pulse to the remaining columns of the leaky memory block Blk[1] until the current leakages of the remaining columns are less than the predetermined level. If the controller 12 determines that the last bit line BL1[N] of the leaky memory block Blk[1] has been reached in Step S626, the controller 12 enters the standby mode (S630).

Accordingly, the memory device 1 and the over-erasure correction methods 3, 5, 6 are utilized to perform over-erasure verifications on the basis of a search group and perform over-erasure corrections on the basis of a search group or a memory block, thereby delivering quick and accurate over-erasure correction, reducing unwanted power dissipation loss, decreasing erroneous data reads and enhancing programming performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An over-erasure correction method for use in a memory device, the memory device comprising a plurality of memory blocks, each memory block comprising a plurality of columns of memory cells, each column of memory cells being coupled to a corresponding bit line, and the over-erasure correction method comprising:
   upon completion of a power-up sequence, detecting if a current leakage of corresponding columns in a group of the memory blocks is greater than a predetermined level; and
   if the current leakage of the corresponding columns in the group of the memory blocks is greater than the predetermined level, performing an over-erasure correction on the corresponding columns.

2. The over-erasure correction method of claim 1, wherein detecting if the current leakage of the corresponding columns in the group of the memory blocks is greater than the predetermined level comprises:
   simultaneously selecting bit lines coupled to the corresponding columns to detect the current leakage.

3. The over-erasure correction method of claim 1, wherein the group of the memory blocks comprises two or more memory blocks.

4. The over-erasure correction method of claim 1, wherein performing the over-erasure correction on the corresponding columns comprises:
   applying at least one over-erasure correction pulse to the corresponding columns.

5. An over-erasure correction method for use in a memory device, the memory device comprising a plurality of memory blocks, each memory block comprising a plurality of columns of memory cells, each column of memory cells being coupled to a corresponding bit line, and the over-erasure correction method comprising:
   upon completion of a power-up sequence, detecting if a current leakage of corresponding columns in a group of the memory blocks is greater than a predetermined level;
   if the current leakage of the corresponding columns in the group of the memory blocks is greater than the predetermined level, determining which memory block of the group of the memory blocks is a leaky memory block; and
   performing an over-erasure correction on a corresponding column of the leaky memory block.

6. The over-erasure correction method of claim 5, wherein determining which memory block of the group of the memory blocks is the leaky memory block comprises:
   selecting a bit line coupled to a corresponding column of a memory block of the group of the memory blocks while deselecting bit lines coupled to corresponding columns of remaining memory blocks of the group of the memory blocks to detect if the memory block is the leaky memory block.

7. The over-erasure correction method of claim 5, further comprising:
   determining if a column of the leaky memory block following the corresponding column of the leaky memory block has another current leakage.

8. The over-erasure correction method of claim 7, further comprising:
   performing an over-erasure correction on the column of the leaky memory block following the corresponding column of the leaky memory block if the column of the leaky memory block following the corresponding column of the leaky memory block has the another current leakage.

9. The over-erasure correction method of claim 5 wherein performing the over-erasure correction on the corresponding column of the leaky memory block comprises:
   applying at least one over-erasure correction pulse to the corresponding column of the leaky memory block until another current leakage of the corresponding column of the leaky memory block is less than the predetermined level.

10. A memory device comprising:
    a plurality of bit lines;
    a group of memory blocks coupled to the plurality of bit lines, each memory block comprising a plurality of columns of memory cells and block selecting switches respectively coupled to the plurality of columns of memory cells, each column of memory cells being coupled to a corresponding bit line; and
    a controller coupled to the group of the memory blocks, and configured to select, upon completion of a power-up sequence, the block selecting switches to detect if a current leakage of corresponding columns in the group of the memory blocks is greater than a predetermined level;
    wherein the controller is further configured to apply an over-erasure correction to the corresponding columns if the current leakage of the corresponding columns in the group of the memory blocks is greater than the predetermined level.

11. The memory device of claim 10, further comprising a sensing circuit coupled to the controller, wherein the controller is further configured to simultaneously select bit lines coupled to the corresponding columns for the sensing circuit to detect the current leakage.

12. The memory device of claim 10, wherein the memory device is a NOR-type flash memory.

13. A memory device comprising:
a plurality of bit lines;
a group of memory blocks coupled to the plurality of bit lines, each memory block comprising a plurality of columns of memory cells and block selecting switches respectively coupled to the plurality of columns of memory cells, each column of memory cells being coupled to a corresponding bit line; and
a controller coupled to the group of memory blocks, and configured to select, upon completion of a power-up sequence, the block selecting switches to detect if a current leakage of corresponding columns in a group of memory blocks is greater than a predetermined level;
wherein if the current leakage of the corresponding columns in the group of the memory blocks is greater than the predetermined level, the controller is further configured to determine which memory block of the group of the memory blocks is a leaky memory block, and perform a first over-erasure correction on a corresponding column of the leaky memory block.

14. The memory device of claim 13, wherein the controller is configured to select a bit line coupled to a corresponding column of a memory block of the group of the memory blocks while deselecting bit lines coupled to corresponding columns of remaining memory blocks of the group of the memory blocks to detect if the memory block is the leaky memory block.

15. The memory device of claim 13, wherein the controller is further configured to determine if a column of the leaky memory block following the corresponding column of the leaky memory block has another current leakage.

16. The memory device of claim 15, wherein the controller is further configured to perform a second over-erasure correction on the column of the leaky memory block following the corresponding column of the leaky memory block if the column of the leaky memory block following the corresponding column of the leaky memory block has the another current leakage.

17. The memory device of claim 13, wherein the controller is configured to apply at least one over-erasure correction pulse to the corresponding column of the leaky memory block until another current leakage of the corresponding column is less than the predetermined level.

* * * * *